United States Patent [19]

Hongu et al.

[11] 4,283,792
[45] Aug. 11, 1981

[54] AUTOMATIC FINE TUNING CIRCUIT

[75] Inventors: Masayuki Hongu, Kawasaki; Shigeru Ohmuro, Higashimine; Masaharu Tokuhara, Tokyo, all of Japan

[73] Assignee: Sony Corporation, Tokyo, Japan

[21] Appl. No.: 25,034

[22] Filed: Mar. 29, 1979

[30] Foreign Application Priority Data

Mar. 30, 1978 [JP] Japan ............................... 53-37115
Mar. 30, 1978 [JP] Japan ............................... 53-37116

[51] Int. Cl.³ .......................... H04B 1/26; H04N 5/50
[52] U.S. Cl. ................................. 455/192; 455/258; 358/195.1
[58] Field of Search ............... 455/192, 164, 182, 257, 455/258, 261, 263, 265, 260; 358/195.1

[56] References Cited

U.S. PATENT DOCUMENTS

| | | | |
|---|---|---|---|
| 3,842,198 | 10/1974 | Martin | 358/195 |
| 3,922,483 | 11/1975 | Indri | 358/195 |
| 3,968,325 | 7/1976 | Beriere | 358/195 |
| 4,091,421 | 5/1978 | Long | 358/195 |

FOREIGN PATENT DOCUMENTS

1243391 of 1971 United Kingdom ............... 455/214

*Primary Examiner*—Jin F. Ng
*Attorney, Agent, or Firm*—Lewis H. Eslinger; Alvin Sinderbrand

[57] ABSTRACT

In a system in which an intermediate frequency signal is synchronously detected using an intermediate frequency carrier signal derived from the intermediate frequency signal by means of a tuned circuit and a limiter circuit to remove amplitude variations therefrom, an automatic fine tuning signal is derived in a phase detector to which are fed the intermediate frequency carrier signal after its phase has been shifted 90 degrees in a phase shifter and either the intermediate frequency signal or the intermediate frequency carrier signal. When the intermediate frequency carrier signal is used in the phase detector, a second tuned circuit is used therein and buffering between the two tuned circuits prevents interaction therebetween.

6 Claims, 7 Drawing Figures

AUTOMATIC FINE TUNING CIRCUIT

BACKGROUND OF THE INVENTION

The present invention relates to an automatic fine tuning circuit, and more specifically to an automatic fine tuning circuit for use with a television receiver circuit.

In a television receiving system, there is known a detection circuit in which the video intermediate frequency signal is detected in a product detector which employs a video intermediate frequency carrier signal derived from the intermediate frequency signal itself. The derived video intermediate frequency carrier signal can be used for automatic fine tuning of the frequency of a local oscillator to maintain the intermediate frequency carrier signal at a desired frequency. In such an automatic fine tuning circuit, a signal from a tuned circuit in a limiter which produces the intermediate frequency carrier is phase shifted by 90 degrees and applied to a second tuned circuit associated with a phase detector. The intermediate frequency carrier signal is also applied to the second input of the phase detector without being phase shifted. The phase detector detects a signal which is proportional in amplitude and direction to the difference between the intermediate frequency carrier signal and the desired center frequency of the intermediate frequency carrier. This derived automatic fine tuning signal is applied to the local oscillator whose frequency is thereby changed in a direction which adjusts the intermediate frequency carrier signal to the proper frequency.

The presence of two tuned circuits coupled together by phase shifter capacitors produces significant interaction between the two tuned circuits. Consequently, when initially aligning the system, a repetitive, interactive, adjustment of the two tuned circuits is necessary. Furthermore, the necessity for employing a second tuned circuit for the automatic fine tuning function adds to the cost of production.

OBJECTS AND SUMMARY OF THE INVENTION

It is an object of the present invention to provide an automatic fine tuning circuit which overcomes the disadvantages of the prior art.

It is a further object of this invention to provide an automatic fine tuning circuit which may permit omission of a second tuning circuit for the automatic fine tuning function.

It is a further object of the invention to provide an automatic fine tuning circuit in which a single adjustment for video detection and automatic fine tuning can be employed to permit quick and accurate adjustment.

It is a further object of this invention to provide an automatic fine tuning circuit having fewer parts than the prior art.

It is a still further object of this invention to provide an automatic fine tuning circuit having a buffer between the tuning circuit of the limiter and the tuning circuit of the automatic fine tuning device to prevent interaction between the two tuning circuits.

According to an aspect of the invention, a circuit for a radio frequency receiving system of the type having tuning means including a local oscillator effective to generate a local oscillator frequency for producing an intermediate frequency signal, comprises electrical means for varying the local oscillator frequency in response to an automatic fine tuning control signal, means for deriving an intermediate frequency carrier signal having a phase from the intermediate frequency signal, means for shifting the phase of the intermediate frequency carrier signal 90 electrical degrees, phase detector means responsive to a predetermined phase difference between the phase shifted intermediate frequency carrier signal and a signal containing the intermediate frequency which does not have its phase shifted 90 electrical degrees for producing the automatic fine tuning control signal, and means for preventing interaction between the phase detector means and the means for deriving the intermediate frequency carrier signal.

The above, and other objects, features and advantages of the present invention, will become apparent from the following description read in conjunction with the accompanying drawings in which like numerals designate the same elements.

DETAILED DESCRIPTION OF THE PREFERRED EMBODIMENT

Figure 1:
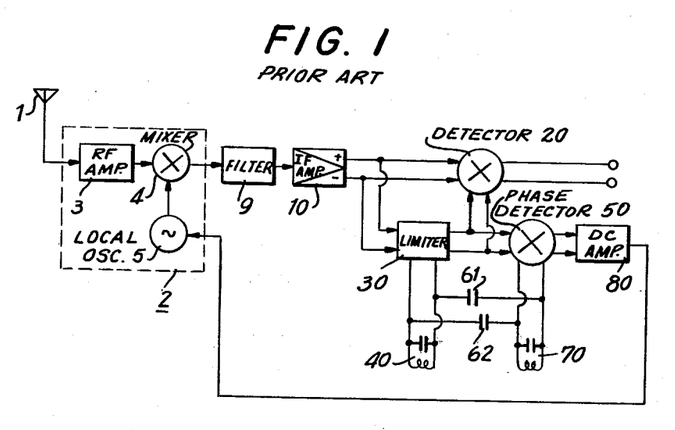
FIG. 1 is a simplified block diagram of a television circuit including an automatic fine tuning circuit according to the prior art.

Referring to FIG. 1, there is shown television apparatus according to the prior art including an automatic fine tuning device. A television signal from an antenna 1 is applied to a tuning circuit 2 containing a radio frequency amplifier 3 which applies an amplified radio frequency signal to one input of a mixer 4. A local oscillator 5 applies a local oscillator frequency to a second input of mixer 4 to produce an output from mixer 4 which includes an intermediate frequency signal having a carrier frequency, according to the NTSC standard, of for example, 58.75 MHz. The frequency of local oscillator 5 is electrically controllable using an automatic fine tuning signal.

The intermediate frequency signal from tuning circuit 2 is filtered in a filter 9 and is applied to an intermediate frequency amplifier 10. Positive and negative phases of the intermediate frequency signal from intermediate frequency amplifier 10 are connected to a detector 20 and to a limiter 30. Limiter 30, which employs an LC tuning circuit 40 tuned to the intermediate frequency carrier frequency, limits amplitude variations in the intermediate frequency signal and thus produces an output which consists essentially of the 58.75 MHz intermediate frequency carrier signal. This intermediate frequency carrier signal is applied to inputs of a detector 20. Detector 20, which may be a product detector, employs synchronous, or switching, detection to demodulate the intermediate frequency signal.

The intermediate frequency carrier signal is also applied to inputs of a phase detector 50. In addition, the intermediate frequency carrier signal at limiter tuning circuit 40 is phase shifted 90 degrees in phase-shift capacitors 61 and 62 and applied to an AFT tuning circuit 70 also tuned to the intermediate frequency carrier frequency which is associated with phase detector 50. Phase detector 50 compares the phases of its two input signals and produces an output which is proportional in amplitude and polarity to the departure of the intermediate frequency carrier signal from its center frequency of, for example, 58.75 MHz. The output of phase detector 50 is applied to a differential DC amplifier 80 where it is amplified, smoothed, and fed back to local oscillator 5 to control the frequency output of local oscillator 5 in a direction to return the intermediate frequency carrier signal to the desired frequency.

The automatic fine tuning circuit according to the prior art shown in FIG. 1 has the disadvantage that the tuning of AFT tuning circuit 70 interacts with the tuning of limiter tuning circuit 40. Consequently, in order to adjust the apparatus for proper detection and automatic fine tuning during manufacture, both limiter tuning circuit 40 and AFT tuning circuit 70 must be adjusted by going back and forth between adjustments until proper operation is achieved.

Figure 2:
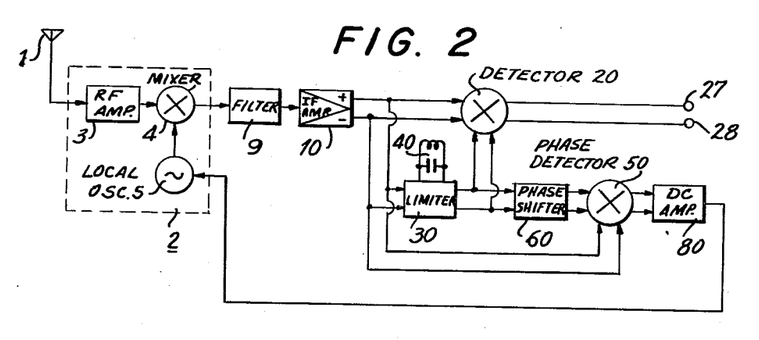
FIG. 2 is a simplified block diagram of a television circuit containing an automatic fine tuning circuit according to an embodiment of the present invention.

Referring now to FIG. 2, there is shown an embodiment of the present invention in which the positive and negative phases of the intermediate frequency signal from intermediate frequency amplifier 10 are applied to detector 20 and limiter 30 as in the prior art, but the unlimited intermediate frequency signal is connected to bypass limiter 30 and is applied directly to inputs of phase detector 50. The output of limiter 30 is applied to inputs of detector 20 and to a phase shifter 60 which contains therein a buffer amplifier which isolates its input from changes in its output. The output of phase shifter 60 is applied to phase detector 50. It will be noticed that there is no AFT tuning circuit associated with phase shifter 60. By applying the intermediate frequency signal directly to inputs of phase detector 50 instead of using the limited intermediate frequency carrier signal, the present invention as shown in FIG. 2 permits omitting the cost both of providing and of adjusting the second tuning circuit required in the prior art. Omission of the second tuning circuit is possible because the phase change with frequency detected in phase detector 50 arises from the influence of limiter tuning circuit 40. The intermediate frequency signal is not influenced by limiter tuning circuit 40 and therefore the required phase change with frequency between its inputs is detectable in phase detector 50. Consequently, correct adjustment both for detection in detector 20 and for automatic fine tuning in phase detector 50 are accomplished by a single adjustment of limiter tuning circuit 40. Improved operation may be obtainable by employing a tuning circuit (not shown in FIG. 2) between phase shifter 60 and phase detector 50. In this case, the buffering provided in phase shifter 60, as well as other optional buffering devices, prevents interaction between the two tuning circuits.

Figure 3:
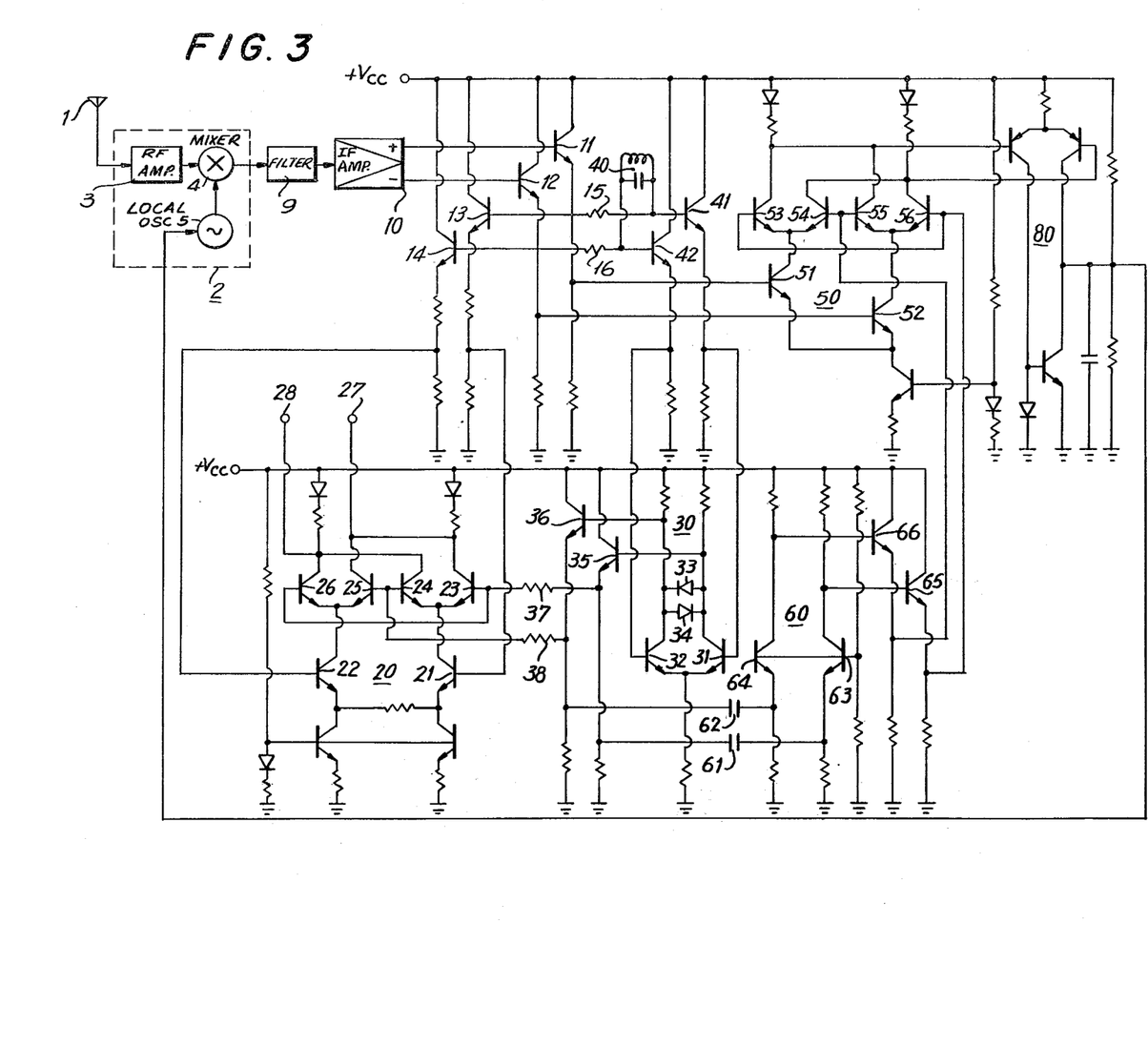
FIG. 3 is a detailed schematic diagram of one circuit according to the embodiment shown in FIG. 2.

Referring now to FIG. 3, there is shown a detailed schematic diagram of a first circuit according to the embodiment of the invention shown in FIG. 2. A received radio frequency signal from antenna 1 is frequency converted in tuning circuit 2, filtered in filter 9 and amplified in intermediate frequency amplifier 10, as in the circuits shown in FIGS. 1 and 2. Positive and negative phases of the intermediate frequency signal from intermediate frequency amplifier 10 are applied to bases of emitter followers 11 and 12. The intermediate frequency signals appearing at the emitters of emitter followers 11 and 12 are applied through decoupling resistors 15 and 16 to a limiter tuning circuit 40. The intermediate frequency signals from tuning circuit 40 are applied to the bases of emitter followers 41 and 42. The intermediate frequency signals appearing at the emitters of emitter followers 41 and 42 are applied to the bases of transistors 31 and 32 of limiter 30. Transistors 31 and 32 amplify their input signals but the amplitudes of their outputs are sharply limited by parallel, oppositely polarized, diodes 33 and 34 connected between their collectors. Due to the amplitude of the signals applied thereto, diodes 33 and 34 remove substantially all of the amplitude modulation from the signals and leave only the carrier frequency component which is thereupon applied to the bases of emitter follower transistors 35 and 36. The intermediate frequency carrier signals appearing at the emitters of emitter followers 35 and 36 are applied through decoupling resistors 37 and 38 to detector 20. Decoupling resistors 37 and 38 may not be required in some circuits.

One phase of the intermediate frequency carrier signal from decoupling resistor 37 is applied to bases of product detector transistors 23 and 26. The other phase of the intermediate frequency carrier signal from decoupling resistor 38 is applied to the bases of product detector transistors 24 and 25.

The intermediate frequency signals appearing at the bases of emitter follower transistors 11 and 12 are also applied to the bases of emitter follower transistors 13 and 14. It should be noted that emitter followers 11 and 13 as well as emitter followers 12 and 14 form Darlington pairs which decouple their inputs and outputs by a factor equal to the product of their gains. The intermediate frequency signals appearing at the emitters of emitter followers 13 and 14 are applied to the bases of product detector transistors 21 and 22 of video detector 20. Video detector 20 detects the vector product of the video intermediate frequency signals applied to transistors 21 and 22 and the intermediate frequency carrier signals applied to transistors 23–26. The detected video signals from video detector 20 are applied to video output terminals 27 and 28.

The limited intermediate frequency carrier signals at the emitters of emitter followers 35 and 36 are also connected through phase shifter capacitors 61 and 62 to the emitters of buffer transistors 63 and 64 which are connected in common base configuration with their bases being maintained at a fixed voltage by voltage divider resistors from supply voltage $+V_{cc}$ to ground. The buffered signals from buffer transistors 63 and 64 are further isolated by emitter follower transistors 65 and 66 and are applied to inputs of phase detector 50. The signal appearing at the emitter of emitter follower 65 is applied to the bases of product detector transistors 53 and 56 in phase detector 50. The signal appearing at the emitter of emitter follower 66 is applied to the bases of product detector transistors 54 and 55.

The signals at the emitters of emitter followers 11 and 12 are also connected to bases of product detector transistors 51 and 52 in phase detector 50. Phase detector 50 detects the vector product of its inputs. However, due to the 90 degree phase shift applied to one of its inputs by phase shifter 60, the output of phase detector 50 is normally zero when the intermediate frequency carrier signal is at its proper frequency. When the intermediate frequency carrier signal departs from its proper frequency, a phase shift imparted to it by limiter tuning circuit 40 causes phase detector 50 to produce outputs which are proportional in amplitude and polarity to the frequency error in the intermediate frequency carrier. The output signals appearing at the collectors of product detector transistors 53, 54, 55 and 56 are applied to DC amplifier 80 where they are amplified and smoothed to produce an AFT signal. As previously noted, the AFT signal is fed back to local oscillator 5 in tuning circuit 2 wherein it changes the frequency of local oscillator 5 as necessary to adjust the frequency of the intermediate frequency carrier signal appearing at the output of limiter 30 to the desired intermediate frequency as determined by limiter tuning circuit 40.

Figure 4:
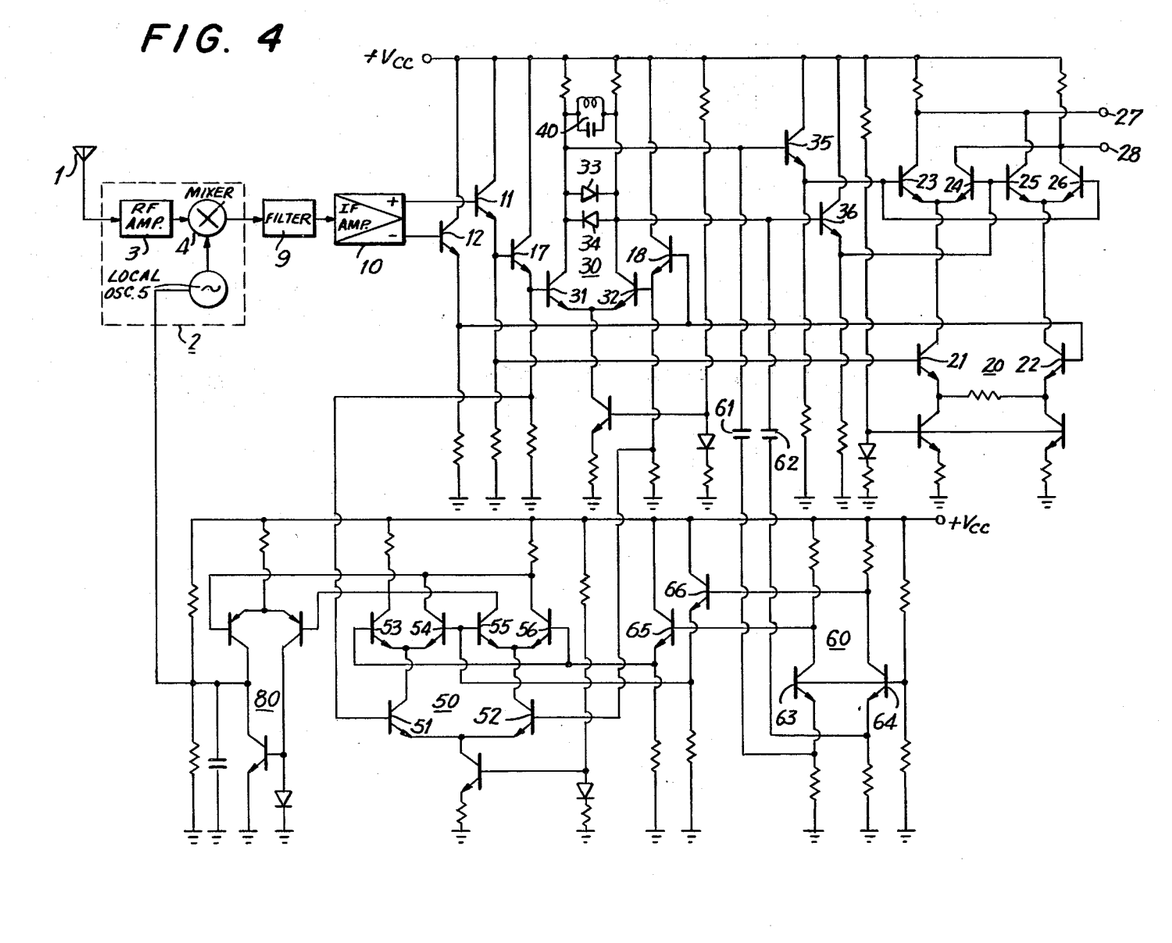
FIG. 4 is a detailed schematic diagram of another circuit according to the embodiment shown in FIG. 2.

Referring now to FIG. 4, in which elements having the same function as in FIG. 3 are identified with the same reference numerals, only the differences between FIG. 4 and FIG. 3 will be described in detail. In FIG. 4, tuning circuit 40 is relocated from the input side to the output side of limiter 30 and decoupling resistors 15 and 16 are omitted. In addition, emitter followers 13 and 14 (forming the second members of the Darlington pairs of FIG. 3) are also omitted. Further, emitter followers 35 and 36 are relocated in the signal path to detector 20 where they replace decoupling resistors 37 and 38.

As in the embodiment of FIG. 3, the unlimited intermediate frequency signal is phase compared in phase detector 50 with the limited and 90-degree-phase-shifted intermediate frequency carrier signal. Since the circuit of FIG. 4 includes only a single tuning circuit 40, a single adjustment is satisfactory to simultaneously provide proper detection and automatic fine tuning.

Figure 5:
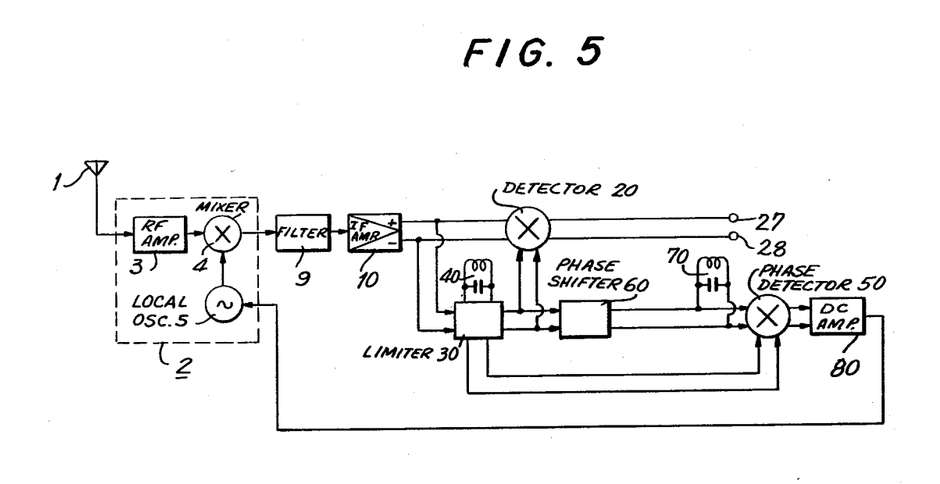
FIG. 5 is a simplified block diagram containing an automatic fine tuning circuit according to a second embodiment of the present invention.

Referring now to FIG. 5, another embodiment of the present invention is shown which employs the outputs of limiter 30 as one of the inputs to phase detector 50 and the outputs of phase shifter 60 as the other input to phase detector 50. In this case, an AFT tuning circuit 70 is shown connected to the output of phase shifter 60. As previously noted, the buffering provided by phase shifter 60 is effective to prevent interaction between limiter tuning circuit 40 and AFT tuning circuit 70. The remaining circuits in FIG. 5 have the same functions as the circuits shown in FIG. 2.

Figure 6:
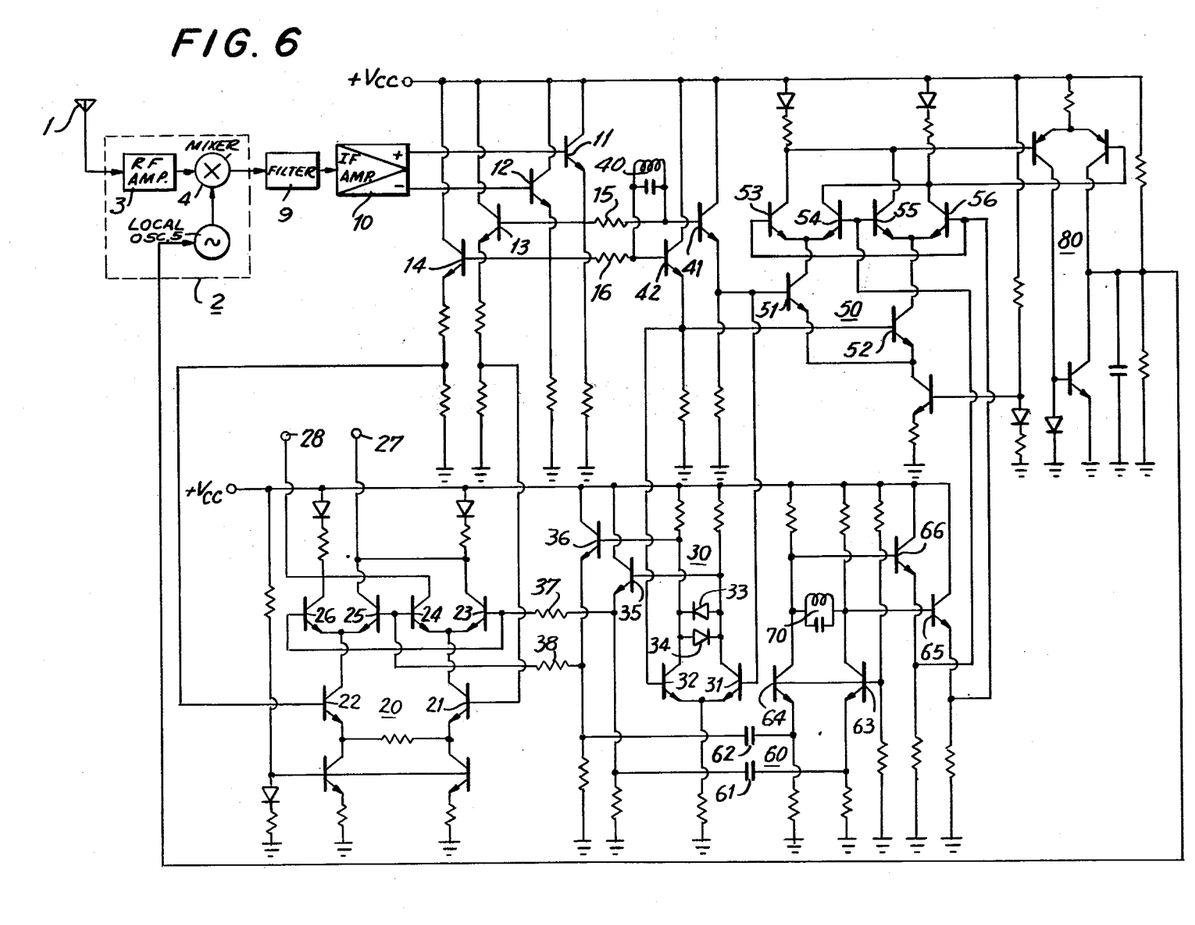
FIG. 6 is a detailed schematic diagram of a circuit according to the embodiment shown in FIG. 2.

FIG. 6 is a circuit according to the embodiment of FIG. 5 in which the signals applied to phase detector 50 are taken from the outputs of emitter followers 41 and 42 which follow, and are influenced by, limiter tuning circuit 40. Since the signal fed from emitter followers 41 and 42 contains the phase variations with frequency imparted by limiter tuning circuit 40, a second tuning circuit 70 is required on the buffered outputs of phase shifter 60 to provide the required phase difference between the inputs of phase detector 50 for producing an automatic fine tuning signal. The buffering provided by buffer transistors 63 and 64 in phase shifter 60 as well as by transistors 35, 36, 31, 32, 42 and 41 between limiter tuning circuit 40 and AFT tuning circuit 70 avoids the interaction between these circuits which complicated adjustment in the prior art. The remainder of the circuit of FIG. 6 is similar to the circuit of FIG. 3 and thus its detailed description is omitted.

Figure 7:
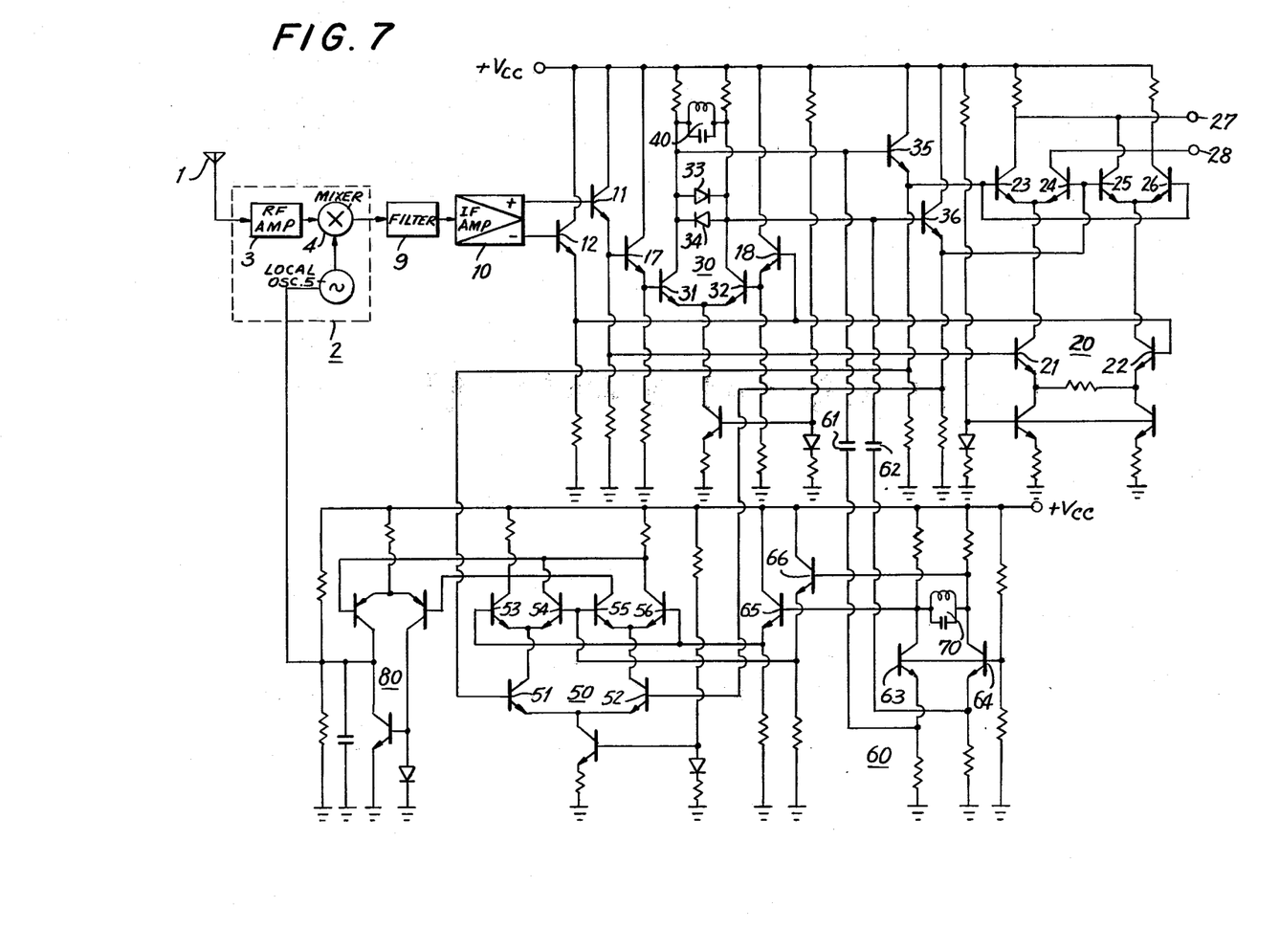
FIG. 7 is a detailed schematic diagram of a second circuit according to the embodiment of FIG. 5.

Referring now to FIG. 7, a detailed schematic diagram of a second circuit according to the embodiment of FIG. 5 is shown. The embodiment of FIG. 7 is most similar to the embodiment of FIG. 4 except that both inputs to phase detector 50 originate in the intermediate frequency carrier signals from limiter 30 rather than employing an intermediate frequency signal as one of the inputs such as was employed in FIG. 4.

Due to the similarity between the circuits in FIGS. 4 and 7, only the differences between these circuits will be described in detail. The limited intermediate frequency carrier signals appearing at the collectors of limiter transistors 31 and 32 are applied through phase shifter capacitors 61 and 62 to the emitters of buffer transistors 63 and 64. AFT tuning circuit 70 is connected between the collectors of buffer transistors 63 and 64. The outputs of phase detector 60 are applied through emitter followers 65 and 66 to phase detector 50. The outputs of limiter 30 are also applied through emitter followers 35 and 36 to inputs of detector 20 and phase detector 50. The remaining functions of the circuits of FIG. 7 are the same as circuits previously described.

According to the preceding description, when one of the inputs to phase detector 50 is taken ahead of limiter 30 and is isolated from at least some of the phase shift imparted to the intermediate frequency carrier signal by limiter tuning circuit 40, an AFT tuning circuit 70 may be omitted, as shown in the detailed embodiments of FIGS. 3 and 4, or it may optionally be provided for improved operation. When both inputs to phase detector 50 are fully influenced by limiter tuning circuit 40, an AFT tuning circuit 70 is required as shown in FIGS. 6 and 7.

Having described specific illustrative embodiments of the invention with reference to the accompanying drawings, it is to be understood that the invention is not limited to these precise embodiments and that various changes and modifications may be effected therein by one skilled in the art without departing from the spirit or scope of the invention as defined in the appended claims. Although the present invention conveniently employs the intermediate frequency carrier signal derived from the intermediate frequency signal as a substitute for a local oscillator signal in a video signal detector and as an input for deriving an automatic fine tuning control signal, it would be clear to one skilled in the art that the present invention for producing an automatic fine tuning control signal may be used even when other video detection means are employed which do not employ an intermediate frequency carrier signal thus derived.

What is claimed is:

1. A circuit for a radio frequency receiving system of the type having means for providing a radio frequency input and a tuning circuit including a local oscillator effective to generate a local oscillator frequency for producing an intermediate frequency signal comprising: electrical means for varying said local oscillator frequency in response to an automatic fine tuning control signal so that said intermediate frequency signal will substantially have a desired intermediate frequency; means for deriving an intermediate frequency carrier signal from said intermediate frequency signal; capacitor means for shifting the phase of said intermediate frequency carrier signal 90 electrical degrees; phase detector means including resonant means resonant at substantially said desired intermediate frequency, and being responsive to a predetermined phase difference between said phase shifted intermediate frequency carrier signal and a signal having substantially the same fundamental frequency and phase as said intermediate frequency signal for producing said automatic fine tuning control signal; and means for preventing interaction between said resonant means of said phase detector means and said means for deriving an intermediate frequency carrier signal, said means for preventing including buffer amplifier means to which a phase shifted signal from said capacitor means is applied said buffer amplifier means being effective to isolate its input from phase changes at its output.

2. A circuit according to claim 1; wherein said means for deriving an intermediate frequency carrier signal includes limiter means for limiting amplitude variations, and a tuning circuit having a resonant frequency substantially equal to said desired intermediate frequency.

3. In a radio frequency receiving system of the type having means for providing a radio frequency input, and a tuning circuit including a local oscillator effective to generate a local oscillator frequency for producing an intermediate frequency signal: a circuit comprising electrical means for varying said local oscillator frequency in response to an automatic fine tuning control signal so that said intermediate frequency signal will substantially have a desired intermediate frequency; means for deriving an intermediate frequency carrier signal from said intermediate frequency signal; means for shifting the phase of said intermediate frequency carrier signal 90 electrical degrees; and phase detector means supplied with said phase shifted intermediate frequency carrier signal from said means for shifting and said intermediate frequency signal from said tuning circuit, in which said latter signal has not passed through said means for deriving and not had its phase shifted 90 electrical degrees, for producing said automatic fine tuning control signal in response to a predetermined phase difference between said signals supplied thereto.

4. A circuit according to claim 3; wherein said means for shifting includes capacitor means operative for shifting said phase by 90 degrees.

5. A circuit according to claim 3; wherein said means for deriving an intermediate frequency carrier signal includes a limiter means for limiting amplitude variations and a tuning circuit having a resonant frequency substantially equal to said desired intermediate frequency.

6. A circuit for a radio frequency receiving system of the type having means for providing a radio frequency input and a tuning circuit including a local oscillator effective to generate a local oscillator frequency for producing an intermediate frequency signal comprising: electrical means for varying said local oscillator frequency in response to an automatic fine tuning control signal so that said intermediate frequency signal will substantially have a desired intermediate frequency; means for deriving an intermediate frequency carrier signal from said intermediate frequency signal; capacitor means for shifting the phase of said intermediate frequency carrier signal 90 electrical degrees; phase detector means including resonant means resonant at substantially said desired intermediate frequency, and being responsive to a predetermined phase difference between said phase shifted intermediate frequency carrier signal and a signal having substantially the same fundamental frequency and phase as said intermediate frequency signal for producing said automatic fine tuning control signal; and means for preventing interaction between said resonant means of said phase detector means and said means for deriving an intermediate frequency carrier signal, said means for preventing including buffer amplifier means connected between said resonant means and said capacitor means and supplied with a phase shifted signal from said capacitor means, said buffer amplifier means being effective to isolate its input from phase changes at its output.

* * * * *